United States Patent [19]

Black

[11] Patent Number: 5,053,353

[45] Date of Patent: Oct. 1, 1991

[54] FABRICATING DIELECTRIC ISOLATION OF SOI ISLAND SIDE WALL FOR REDUCING LEAKAGE CURRENT

[75] Inventor: Jimmy C. Black, Durham, N.C.

[73] Assignee: Harris Corporation, Melbourne, Fla.

[21] Appl. No.: 641,486

[22] Filed: Jan. 15, 1991

Related U.S. Application Data

[62] Division of Ser. No. 274,176, Nov. 21, 1988.

[51] Int. Cl.$^5$ .................... H01L 21/302; H01L 21/76
[52] U.S. Cl. ........................... 437/62; 437/84; 437/186; 148/DIG. 150
[58] Field of Search ................ 437/61, 62, 84, 44, 437/186; 357/23.7; 148/DIG. 12, DIG. 150

[56] References Cited

U.S. PATENT DOCUMENTS

| | | | |
|---|---|---|---|
| 4,174,217 | 11/1979 | Flatley | 148/DIG. 150 |
| 4,649,626 | 3/1987 | Leong | 148/DIG. 150 |
| 4,680,603 | 7/1987 | Wei et al. | 437/44 |
| 4,755,481 | 7/1988 | Faraone | 437/62 |
| 4,758,529 | 7/1988 | Ipri | 437/84 |
| 4,956,307 | 9/1990 | Pollock et al. | 437/62 |

Primary Examiner—Brian E. Hearn
Assistant Examiner—C. Chaudhari
Attorney, Agent, or Firm—Evenson, Wands, Edwards, Lenahan & McKeown

[57] ABSTRACT

The conducting layer, such as polysilicon, which electrically connects spaced apart semiconductor islands of a semiconductor-on-insulator, such as sapphire, integrated circuit device is further spaced from the base, sides and upper edges of the islands (identified as sites for origination of undesirable leakage currents during operation) by an underlying insulating layer which may include silicon oxide with a dopant such as phosphorus or boron. During processing, the islands provide a self-masking effect when illumination is first passed through the sapphire substrate to expose photoresist. Refraction of the illumination around the upper edges of the islands provides a convenient way to form the insulating layer so that it lips over the edges and slightly onto the top of the islands.

10 Claims, 3 Drawing Sheets

FABRICATING DIELECTRIC ISOLATION OF SOI ISLAND SIDE WALL FOR REDUCING LEAKAGE CURRENT

This application is a divisional application of pending U.S. Ser. No. 274,176, filed Nov. 21, 1988.

BACKGROUND OF THE INVENTION

This invention relates to a semiconductor-on-insulator (SOI) integrated circuit (IC) device, and, more particularly to an SOI IC device having dielectric isolation for the sidewalls of an island, or mesa, disposed on a substrate of an insulator, such as sapphire, for reducing leakage current even in the presence of ionizing radiation, and also to a method for fabrication of the device.

In a typical SOI IC device, an island of a semiconducting material, such as silicon, that is disposed on an electrically insulative substrate, such as sapphire (in which case the device may be referred to as a silicon-on-sapphire (SOS) device) is appropriately implanted with a dopant material imparting the desired type and concentration of majority carriers (e.g. electrons, holes). After a thin, pristine layer of gate oxide is thermally grown over the island, the doped island is ultimately overlaid with a layer of electrically conductive polysilicon for electrically connecting the island with other islands having the same or different semiconductor material and dopants to form an electrical circuit.

In cross section, an island may resemble a rectangle. The polysilicon layer tends to conformally follow the contour of the island so that at the base of the island the electrically insulative substrate, the semi-conducting doped silicon material of the island, an insulative gate oxide layer coating the island and electrically conductive polysilicon are disposed in close proximity to each other. The juncture around the base of the island at the convergence of these materials having diverse electrical characteristics, as well as the silicon/oxide interface, is subject to trapped charges and concentrated electric fields which may result in undesirable leakage currents during circuit operation, especially in the presence of ionizing radiation. Although generally not considered to be as severe, undesirable leakage currents may also arise at the juncture of the top and side wall of the island that is overlaid with polysilicon.

It would be desirable to eliminate sources of potential leakage current without affecting overall operation of the device. In addition, it would be desirable to provide a method for fabricating a device exhibiting improved leakage current characteristics, wherein the method is both economical and compatible with existing technology for manufacture of IC devices.

Accordingly, it is an object of the present invention to reduce the propensity of a SOI IC device to exhibit leakage current from the convergence of the insulative substrate and the side-wall of an island even in the presence of ionizing radiation.

It is another object of the present invention to reduce leakage current from the juncture of the top and side wall of an island of an SOI device.

It is yet another object of the present invention to provide a method for fabricating a silicon-on-insulator integrated circuit having reduced leakage current, wherein the method is economical and may be incorporated into conventional processing systems for SOI devices.

SUMMARY OF THE INVENTION

In accordance with the present invention, an integrated circuit device that exhibits reduced leakage current during operation comprises an electrically insulative substrate like sapphire, first and second spaced apart islands of a respective first and second doped semiconducting material disposed on the substrate and having a respective side wall terminating at the substrate. The device further includes a first and second insulating layer disposed over a portion of the side wall of the first and second islands, respectively, a third insulating layer having a dopant and disposed between each island and over a portion of the first and second insulating layer, and an electrically conducting layer disposed over a portion of the third insulating layer and over a portion of a thin gate oxide that has been grown over a portion of the semiconducting material of the first and second islands. The conducting layer forms electrical flow communication between each island and is spaced from the juncture of each of the first side walls and the substrate by the third insulating layer.

The islands may both include silicon, one being implanted with a dopant, such as arsenic or phosphorus, for creating an N-type region, and the other being implanted with a dopant, such as boron, for creating a P-type region. The third insulating layer may include silicon oxide or dioxide with a dopant of boron or phosphorus.

The islands may have a rectangular cross section with the third insulating layer extending along the side wall and over the edge at the intersection of the top side and the side wall so that the third layer lips onto the top side of the island. When the conducting layer is disposed over a portion of the third layer it is spaced from the side wall, the top edge and the juncture of the side wall and the substrate. Such device configuration has been found to reduce leakage current during operation over devices not having such configuration.

In accordance with another aspect of the present invention, a method for fabricating a semiconductor on insulator integrated circuit device comprises implanting a first and second part of semiconductor material with a first and second dopant, respectively, forming a first insulating layer over a portion of the first and second part of semiconductor material, and forming a second insulating layer over a portion of the first insulating layer. The method further includes forming an etch resistant layer on a portion of the second layer, selectively removing part of the etch-resistant layer to expose the underlying second layer, removing the exposed part of the second layer and corresponding portion of the first layer to expose the first and second semiconducting material, removing the remainder of the etch resistant layer, growing a thin, pristine gate oxide on the first and second semiconducting material, and forming an electrically conducting layer overlaying a portion of the second layer and disposed between the first and second semiconducting material. The conducting layer is spaced from the substrate and the juncture of the first and second part of the semiconductor material with the substrate.

The etch-resistant layer may include a radiation activated material such as photoresist, which may be exposed from the underside of the substrate when the substrate is transparent or at least translucent to the radiation, such as when the substrate comprises sapphire. A benefit of exposing from the underside of the substrate is that the parts of the semiconductor material serve as a self-mask. Further, when the first and second part of the semiconductor material has a rectangular cross section, refraction around the upper edge of each part permits a portion of exposed photoresist to protect a lip of the underlying insulating layers that extends onto the top side of the parts of the semiconductor material from being etched away in subsequent processing. This lip spaces the overlying conducting layer from the upper edge of the semiconductor material.

The second insulating material may include silicon oxide or dioxide and a dopant such as phosphorus or boron. The second layer may be formed by chemical vapor deposition from an atmosphere including oxygen, a source of silicon and a source of the desired dopant.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION OF THE INVENTION

Figure 1:
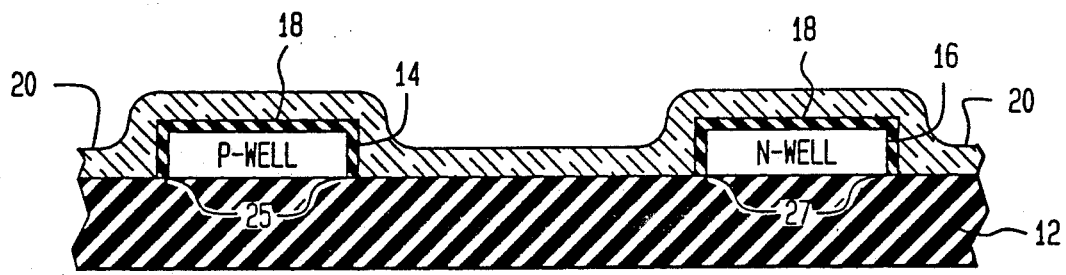
FIG. 1 is a cross section of an intermediate stage of formation of a conventional silicon-on-insulator integrated circuit.

Referring to FIG. 1, a cross section of an intermediate stage of a portion of a conventional silicon-on-insulator integrated circuit (IC) is shown. The IC includes a insulative substrate 12, such as sapphire (Al$_2$O$_3$), having a pair of spaced apart islands, or mesas, 14 and 16 of silicon doped with a first and second polarity dopant, respectively, for forming a P-well and an N-well, respectively. Overlaying each island 14 and 16 is a layer of gate, or channel, oxide 18. A layer of polysilicon 20 is disposed over and between islands 14 and 16 for ultimately providing electrical connection between islands 14 and 16. Doping silicon, formation of gate oxide 18 and depositing polysilicon 20 may be performed by conventional processing.

It is noted that in the area of the intersection 25 and 27 of the side walls of islands 14 and 16, respectively, with substrate 12, materials having diverse electrical characteristics are closely disposed with respect to each other. Thus, conducting layer 20, insulating oxide 18, semiconducting silicon 14 and 16, and insulative substrate 12 are in close proximity to each other at intersections 25 and 27. The diverse electrical characteristics at intersections 25 and 27, may result in unexpected electric fields and trapped charges during operation, which ultimately lead to undesirable leakage currents that adversely affect overall integrated circuit performance, such as by providing spurious electrical indications, especially in the presence of ionizing radiation.

In accordance with the present invention, it has been found that one way to minimize undesirable leakage current is to move the polysilicon layer away from intersection 25 and 27 and away from the side walls of islands 14 and 16.

The invention will be described with reference to FIGS. 2 through 12 which are cross sectional views at predetermined intermediate stages of processing for fabricating an integrated circuit in accordance with the present invention, wherein like reference numerals represent like components throughout. The Figures are not necessarily to scale.

Figure 2:
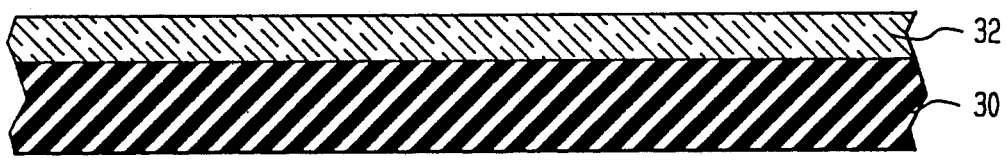
FIGS. 2 through 13 are intermediate stages during fabrication a semiconductor-on-insulator integrated circuit in accordance with the present invention.

As shown in FIG. 2, a substrate 30 may comprise an insulator, such as sapphire (Al$_2$O$_3$), a silicon oxide or spinel, and have a semiconductor layer, such as silicon, 32 disposed on a surface thereof. Layer 32 may include a single crystal of silicon epitaxially grown on the surface of substrate 30 and having a thickness of about 200 nanometers (nm).

Figure 3:

After conventional mask and etching steps are performed to remove predetermined portions of the material of layer 32 from substrate 30, islands, or mesas, 34 and 35 of the semiconducting material remain disposed on substrate 30 as shown in FIG. 3. Islands 34 and 35, having a substantially rectangular cross-section, are illustrative of the type of structure that may remain after the steps of masking and etching of layer 32, it being understood that typically a large plurality of such structures are developed for later electrical interconnection to form the integrated circuit.

Figure 4:

In order to convert the semiconducting material of islands 34 and 35 to the desired type of N-type or P-type material, ion implantation may be used. As shown in FIGS. 3 and 4 for example, when island 34 includes silicon it may be exposed to a predetermined concentration of a first type of dopant, such as boron ions or atoms, for a predetermined interval, while island 35 is shielded or masked from such exposure, for forming a P-well 36. Likewise, when island 35 includes silicon it may be exposed to a predetermined concentration of another type of dopant, such as phosphorus ions or atoms, for a predetermined interval, while island 36 is shielded or masked from such exposure, for forming an N-well 38. The legends "N-WELL" and "P-WELL" are only included in FIG. 4 to avoid undue cluttering of the drawing, it being understood that island 34 may be labelled "P-WELL" and island 35 may be labelled "N-WELL" throughout FIGS. 5–12 of the drawing. Next a sacrificial insulating layer 40, such as silicon oxide, may be formed or grown over and around each of previously doped islands 36 and 38. Layer 40 may be grown over the upper surface and side walls of islands 36 and 38 at elevated temperatures, greater than about 800° C., in an atmosphere rich in oxygen or steam and void of constituents likely to cause undesirable impurities, as is known in the art. Layer 40 is preferably greater than about 10 nm thick.

Figure 6:
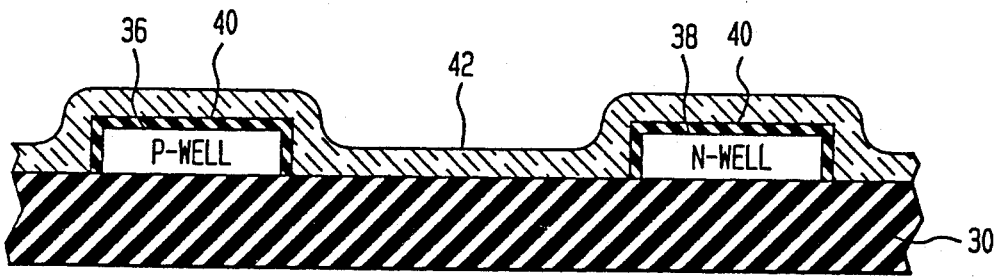

With reference to FIG. 6, an insulating layer 42 is deposited over substrate 30 and layer 40 of islands 36 and 38. Layer 42 comprises an insulating material, such as silicon oxide, having a dopant uniformly dispersed throughout. The dopants for layer 42 may include phosphorus or boron which are believed to provide recombination centers for induced hole-electron pairs that are generated during operation. Layer 40 prevents counter-doping of islands 36 and 38 from doposited layer 42.

Figure 5:
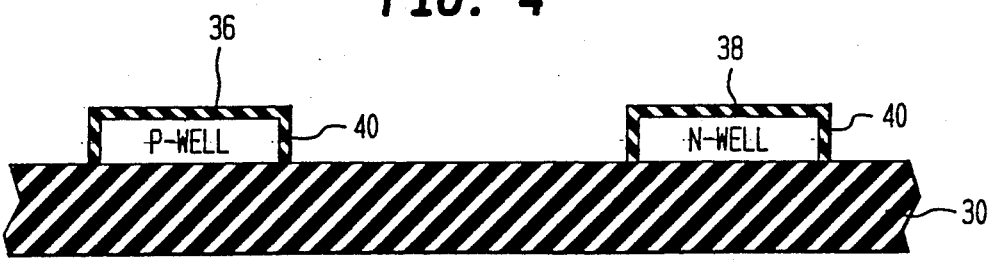

Layer 42 may be formed over the surface of the stage illustrated in FIG. 5 by chemical vapor deposition at a temperature not to exceed about 500° C. at a pressure in the range of about 50 m Torr to about 200 m Torr in a contained vessel. The atmosphere for the chemical vapor deposition may include oxygen, a source of silicon, such as silane (SiH$_4$), and a source of n-type dopant, such as phosphorus from phosphine (PH$_3$) or a source of p-type dopant, such as boron from diborane ($B_2H_6$).

The upper surface of the stage illustrated in FIG. 5 is exposed to the mixture of oxygen, source of silicon and source of dopant in the closed vessel under the above-described conditions until layer 42 having a desired thickness, preferably greater than about 100 nm, is obtained. When the above-identified exemplary components are used, the concentration ratio of silane to oxygen to phosphine may be maintained in the range of about 25-40: 40-65: 10-25 percent by volume, respectively, and the concentration ratio of silane to oxygen to diborane may be maintained in the range of about 20-40: 40-65: 15-25 percent by volume, respectively. The concentration level of phosphine or diborane determines the amount of phosphorus or boron, respectively, that is substantially uniformly disposed throughout the silicon oxide of layer 42.

The ultimate concentration and distribution of the phosphorus or boron doping level of silicon oxide in layer 42 establishes the electrical characteristics of layer 42. It has been found that layer 42 in combination with layer 40 reduces undesirable leakage currents that may be experienced by similar circuitry operating in a similar environment but not including both layer 40 and layer 42 as in accordance with the present invention.

Figure 7:
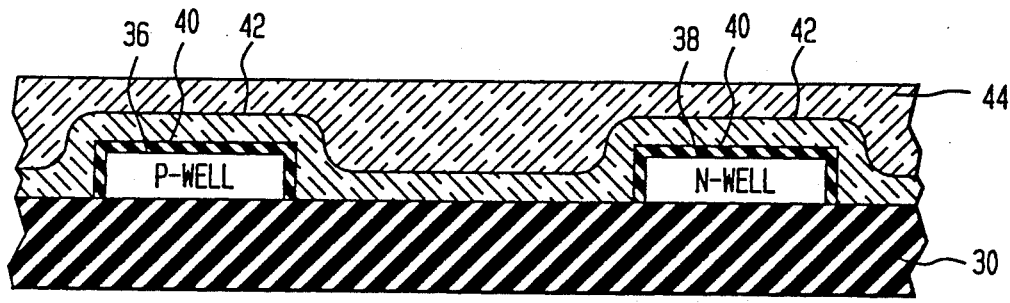

Referring to FIG. 7, another step of processing in accordance with the present invention includes applying a layer 44 of photoresist over layer 42 and islands 36 and 38 with associated layer 40. The formation of layer 44 may be performed in accordance with known techniques. The photoresist may be either a negative resist or a positive resist with image reversal as is known in the art.

Figure 8:
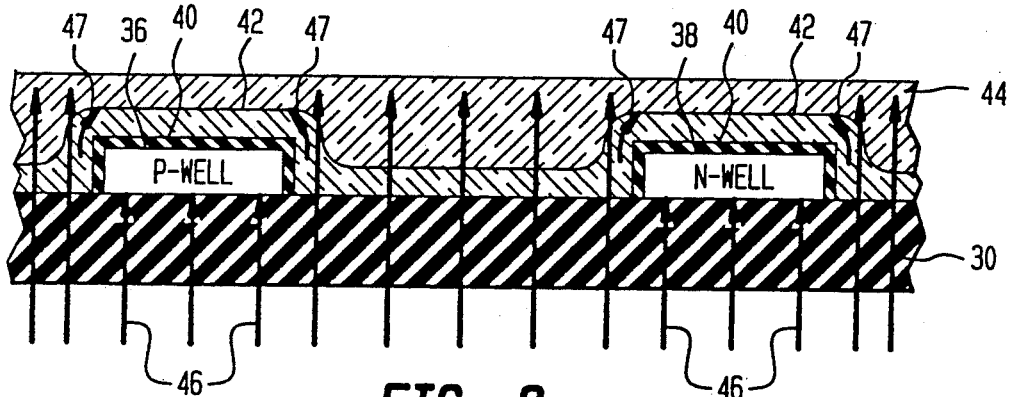

With reference to FIG. 8, yet another processing step includes exposing predetermined portions of layer 44 to exposure radiation 46, such as white light, from the back- or underside, that is, first passing through substrate 30, when substrate 30 includes a material like sapphire that is transparent or at least translucent to radiation 46.

By applying radiation 46 through substrate 30 to expose predetermined portions of layer 44, islands 36 and 38 and corresponding associated layer 40 serve to mask a portion of layer 44 from exposure to radiation 46. Further, a portion 47 of radiation 46 is diffracted toward the center of islands 36 and 38 as it traverses along the sides of islands 36 and 38 and past the intersection of the side wall and upper surface of islands 36 and 38.

Of course, layer 44 could be exposed to radiation 46 from the top side directly first onto layer 44 either when required because substrate 30 is opaque to radiation 46, or if desired even though substrate 30 is transparent or translucent. However, additional masking, along with associated problems of alignment and registration of the masked areas of layer 44 with respect to islands 36 and 38 would have to be addressed, thus losing the benefit of using islands 36 and 38 as self-masking objects while also increasing the number of processing steps over that required in accordance with the present invention.

Figure 9:
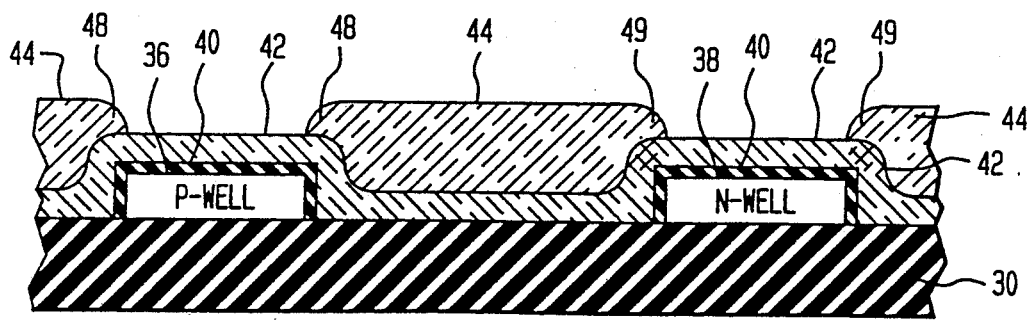

Referring to FIG. 9, layer 44 is next subjected to a developer as is known in the art, and the portions of layer 44 that were not exposed to radiation 46 (that is principally the portion above islands 36 and 38) are removed to expose the upper surface of layer 42. Due to diffraction of radiation 46 around islands 36 and 38 when radiation is applied through substrate 30, a lip or overhang 48 and 49 of exposed layer 44 above island 36 and 38, respectively, is not removed.

Figure 10:
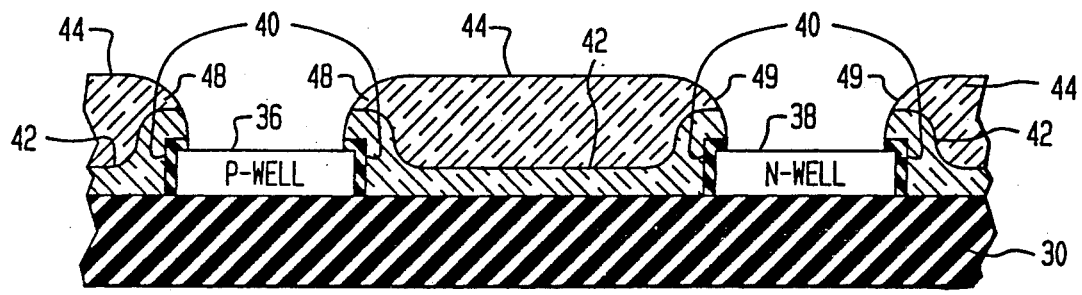

Referring to FIG. 10, an etching process is used to remove the portions of layer 42 along with corresponding portions of layer 40 lying thereunder that are not protected by the remaining portion of etch resistant layer 44. Etching may be performed by subjecting the exposed areas of layer 42 and corresponding underlying areas of layer 40 to a reactive ion, or plasma, etch process or to a wet etch process using an aqueous chemical etchant, such as dilute HF, or to a combination of both, as is known in the art. Etching is allowed to proceed until at least a portion of the upper surface of islands 36 and 38 that is not protected by layer 44 is exposed.

It is noted that lips 48 and 49 of layer 44 allow a portion of layer 40 and 42 to remain wrapped from the side wall around the edge formed at the juncture of the top surface and side wall and onto the top of islands 36 and 38. It is believed that having a portion of layer 40 and 42 extend upwardly beyond the upper edge of island 36 and 38 and onto the top surfaces thereof further reduces undesirable leakage currents. In addition, the positioning of the portion of layers 40 and 42 that overlap the edge from the side wall to the top of islands 36 and 38 has been obtained without resort to additional steps of masking and removal due to diffraction of radiation 46 around islands 36 and 38, which act as registered self-maskers when radiation is introduced through substrate 30.

Conventional masking and material removal steps, wherein processing and radiation exposure is performed from the top side of the device, may be used when desired or when necessary, such as whenever substrate 30 is opaque. For such cases, the mask and processing would be organized to obtain a portion of layer 40 and 42 wrapped around the sides and onto the top of islands 36 and 38 while obtaining an exposed portion of the top surface of islands 36 and 38.

Figure 11:
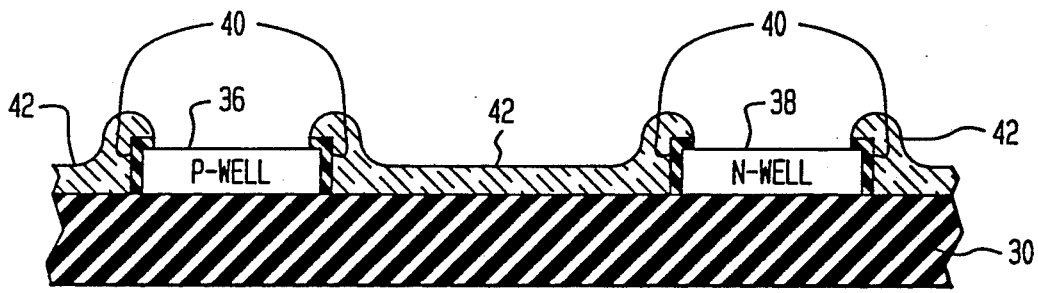
Figure 12:
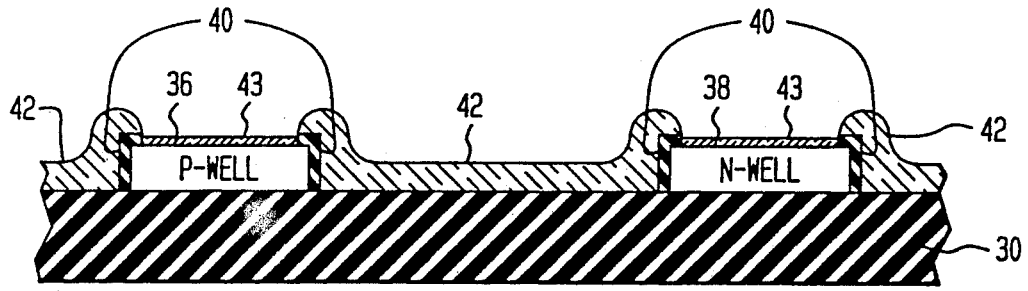
Figure 13:
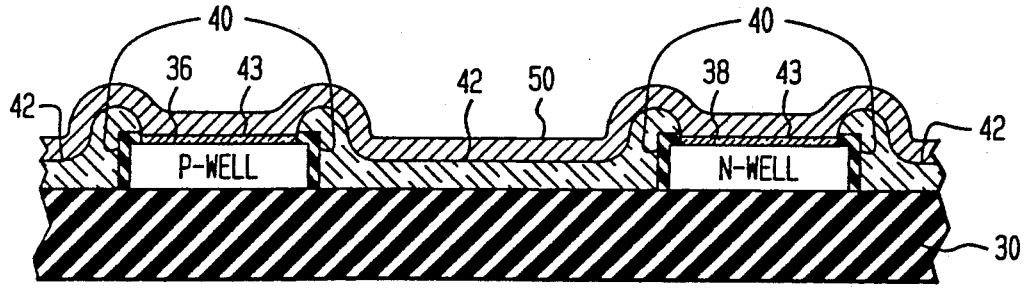

Referring to FIGS. 11, 12 and 13, processing may continue in a conventional manner. Layer 44 is stripped to expose the upper surface of layer 42. The exposed upper surfaces of islands 36 and 38 are re-oxidized to form gating means, such as a thin pristine gate quality oxide layer 43. In forming an inverter, for example, a continuous electrically conducting layer 50, such as polysilicon that is heavily doped with phosphorus for example, may be deposited over a portion of layer 43 and over the outer surface of layer 42 between islands 36 and 38 for establishing an electrically conductive path between island 36 and island 38. Layer 50 only directly contacts a portion of layer 43 on the top surface of islands 36 and 38, being separated from the sides and upper edge of islands 36 and 38, by layers 40 and 42. Also, layer 50 has been displaced or separated from the area of the juncture of the side walls of islands 36 and 38 with substrate 30, so that reduced influence from electrical fields around layer 50 is experienced at the side walls and around the base of islands 36 and 38, thereby reducing undesirable leakage current during operation. In addition, it has been determined that layer 42, including silicon oxide doped as described above, in combination with layer 50, further reduces undesirable leakage current over that experienced with a layer of silicon oxide not including such dopants.

Thus has been illustrated and described a silicon on insulator integrated circuit device having a reduced propensity to exhibit leakage current from the convergence of the side wall of an island with the insulative substrate and the top side of the island even in the presence of ionizing radiation. Further, a method for fabricating a silicon on insulator integrated circuit which exhibits reduced leakage current, wherein the method is both economical and able to be incorporated into conventional processing systems for SOI devices, has been shown and described.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A method for fabricating a semiconductor on insulator integrated circuit device, wherein semiconductor material is disposed on an insulating substrate, comprising:

implanting a first part of the semiconductor material with a first dopant and a second part of the semiconductor material with a second dopant, the first part spaced from the second part so that the first and second part are electrically isolated from each other;

forming a first insulating layer on a portion of the first and second part of the semiconductor material;

forming a second insulating layer on a portion of the first insulating layer of the first and second part of the semiconductor;

forming an etch-resistant layer on a portion of the second insulating layer;

selectively removing part of the etch-resistant layer, thereby exposing part of the underlying second insulating layer;

removing the exposed part of the second insulating layer and a corresponding portion of the underlying first insulating layer, thereby exposing a respective portion of the first and second part of the semiconductor material;

removing the remainder of the etch-resistant layer;

forming gating means over a portion of the exposed first and second part of the semiconductor material; and forming an electrically conducting layer extending from the gating means of the first part to the gating means of the second part of the semiconductor material for establishing an electrical flow communication path through the conducting layer between the first and second part of the semiconductor material, the conducting layer disposed over a portion of the second insulating layer, so that the conducting layer is spaced from the substrate and the juncture of the first and second part of the semiconductor material with the substrate.

2. The method as in claim 1, wherein the substrate includes sapphire, the etch-resistant layer includes a radiation activated material and the step of selectively removing part of the etch-resistant layer includes:

exposing a portion of the etch-resistant layer to radiation, the radiation passing through a portion of the substrate before reaching the etch-resistant layer, wherein a first and second part of the etch-resistant layer is not exposed to the radiation due to the respective self-masking effect of the first and second part of the semiconductor material; and removing the part of the etch-resistant layer that has been exposed to the radiation.

3. The method as in claim 1, wherein the step of forming the second insulating layer includes forming a silicon oxide layer that includes a dopant.

4. The method as in claim 3, wherein the dopant is selected from the group consisting of phosphorus and boron.

5. The method as in claim 3, wherein the step of forming the second insulating layer further includes chemically vapor depositing the second insulating layer from an atmosphere including oxygen, a source of silicon and a source of dopant.

6. The method as in claim 5, wherein the source of silicon includes silane and the source of dopant includes phosphine.

7. The method as in claim 6, wherein the atmosphere includes silane, oxygen, and phosphine having a concentration ratio in the range of about 25–40: 40–65: 10–25 percent by volume, respectively.

8. The method as in claim 5, wherein the source of silicon includes silane and the source of dopant includes diborane.

9. The method as in claim 8, wherein the atmosphere includes silane, oxygen and diborane having a concentration ratio in the range of about 20–40: 40–65: 15–25 percent by volume, respectively.

10. The method as in claim 2, wherein the first and second part of the semiconductor material have a rectangular cross section with opposing first and second side walls terminating at the substrate and a top wall spaced from the substrate and terminating in a first and second edge at the first and second side wall, respectively, and further wherein the step of exposing further includes exposing a portion of the etch-resistant layer to the radiation so that a portion of the etch-resistant layer that is exposed lips over the first edge of the first and second part of the semiconductor material.

* * * * *